(12) United States Patent
Kito (10) Patent No.: US 6,229,178 B1
(45) Date of Patent: May 8, 2001

(54) VERTICAL DOUBLE DIFFUSED MOSFET AND METHOD FOR MANUFACTURING SAME

(75) Inventor: Takayuki Kito, Kyoto (JP)

(73) Assignee: Rohm.Co., Ltd., Kyoto (JP)

( * ) Notice: Subject to any disclaimer, the term of this patent is extended or adjusted under 35 U.S.C. 154(b) by 0 days.

(21) Appl. No.: 09/313,137

(22) Filed: May 17, 1999

(30) Foreign Application Priority Data

May 18, 1998 (JP) .................................................. 10-135282

(51) Int. Cl.[7] .................................................... H01L 29/76
(52) U.S. Cl. ............................................. 257/328; 257/320
(58) Field of Search ..................................... 257/328, 320

(56) References Cited

U.S. PATENT DOCUMENTS 5,101,250 * 3/1992 Arima et al. .

5,621,234 * 4/1997 Kato .

FOREIGN PATENT DOCUMENTS 62-162361 * 7/1987 (JP) .

* cited by examiner

Primary Examiner—Stephen D. Meier
(74) Attorney, Agent, or Firm—Hoffmann & Baron, LLP (57) ABSTRACT

A vertical double diffuses MOSFET includes a nitride film (26) formed on a gate electrode (18). An ion implant window (34) is formed through the nitride film. P-type ions are implanted through the ion implant window into the semiconductor substrate (12), and the implanted ions are diffused to thereby form a main diffusion region (14). At the same time, the oxide film is grown inside the ion implant window to form a thick walled portion (36). Ions of the p-type are implanted through, as a mask, the thick walled portion, gate electrode and nitride film into semiconductor substrate, and thermally diffused thus forming a channel diffusion region (22). Further, n-type ions are implanted through the same mask and then thermally diffused to provide source diffusion regions.

3 Claims, 7 Drawing Sheets

PRIOR ART

VERTICAL DOUBLE DIFFUSED MOSFET AND METHOD FOR MANUFACTURING SAME

BACKGROUND OF THE INVENTION

1. Field of the Invention

This invention relates to a vertical double diffused MOSFET and method for manufacturing same, and more particularly to a vertical double diffused MOSFET manufactured through a self-aligned process which is applicable for switching power sources, AC adapters, battery chargers, motor control circuits, inverter illumination, DC/DC converters or the like, and a method for manufacturing such a device.

2. Description of the Prior Art

Figure 3:
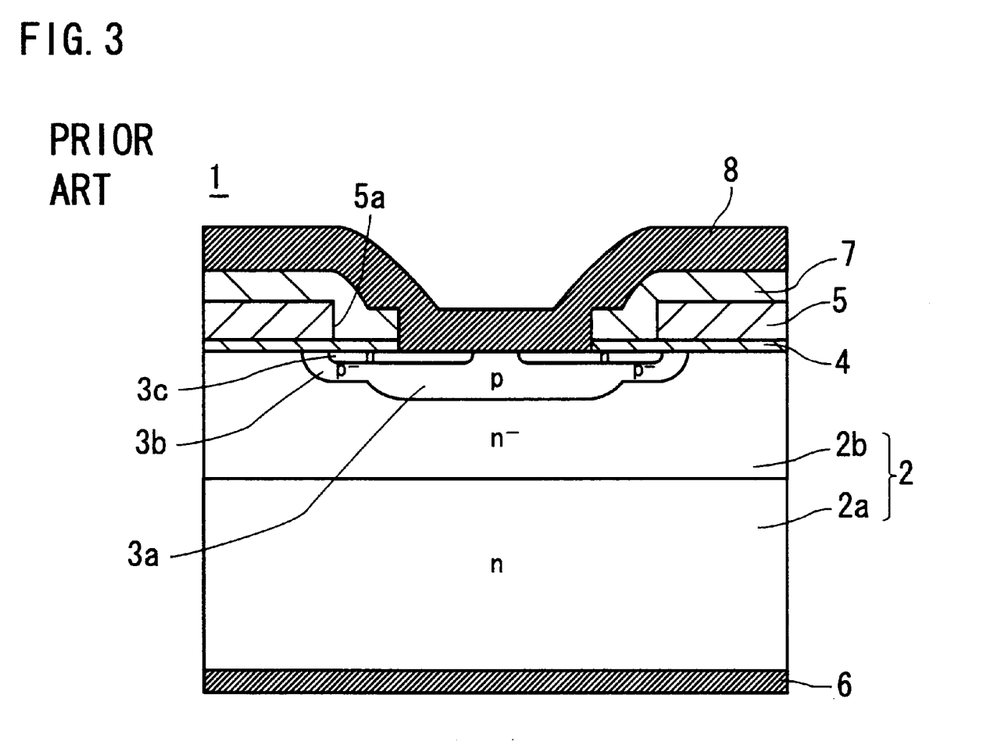
FIG. 3 is an illustrative view showing a conventional vertical double diffused MOSFET.

There is shown in FIG. 3 a conventional vertical double diffused MOSFET of the kind as above. The MOSFET 1 includes a semiconductor substrate 2 having a main body 2a and an epitaxial layer 2b. The semiconductor substrate 2 has a main diffusion region 3a formed in a surface thereof. The semiconductor substrate 2 has, on the surface, a gate electrode 5 having at least one window 5a formed through an oxide film 4. The semiconductor substrate 2 is formed, at its bottom surface, with a drain electrode 6. Also, in the surface of the semiconductor substrate 2, a channel diffusion region 3b and source diffusion region 3c is formed in relation to the gate electrode 5 at a peripheral edge of the window 5a. On the gate electrode 5 an insulation layer 7 is formed of oxide silicon containing phosphorus (PSG). Over the insulation layer 7, a metal interconnect layer (source electrode) 8 is formed connecting to a source diffusion region 3c.

Figure 4A:
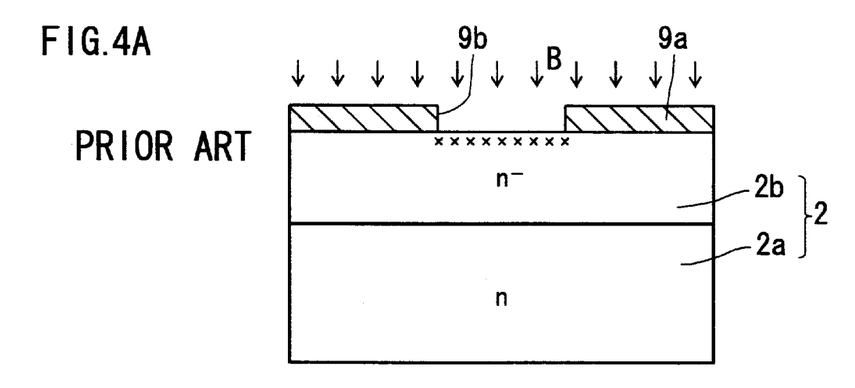
FIGS. 4A–FIG. 4F are sectional views showing a process for the conventional vertical double diffused MOSFET.
Figure 4B:
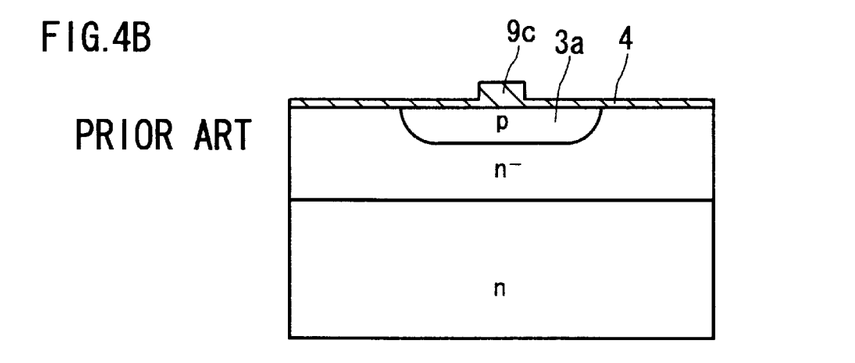
Figure 4C:
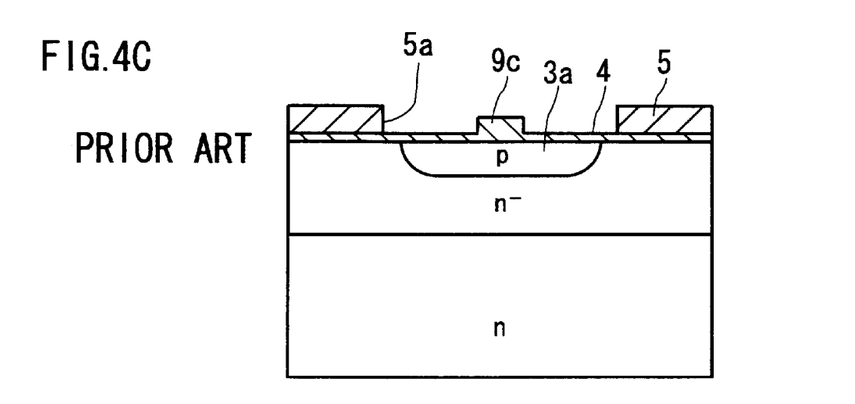
Figure 4D:
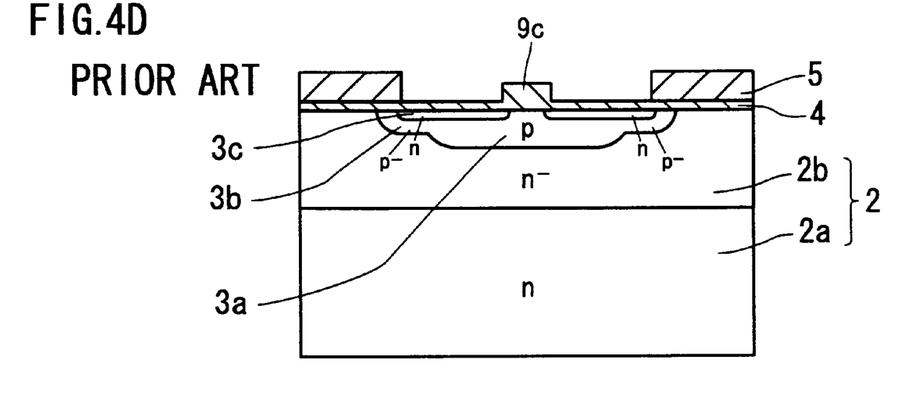
Figure 4E:
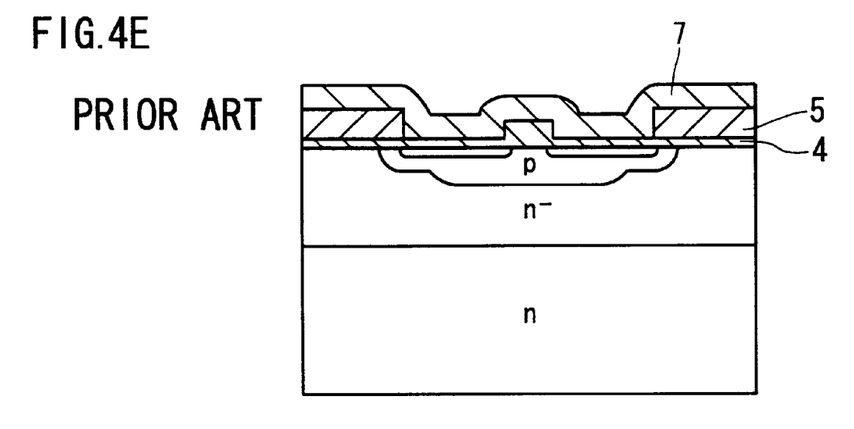
Figure 4F:
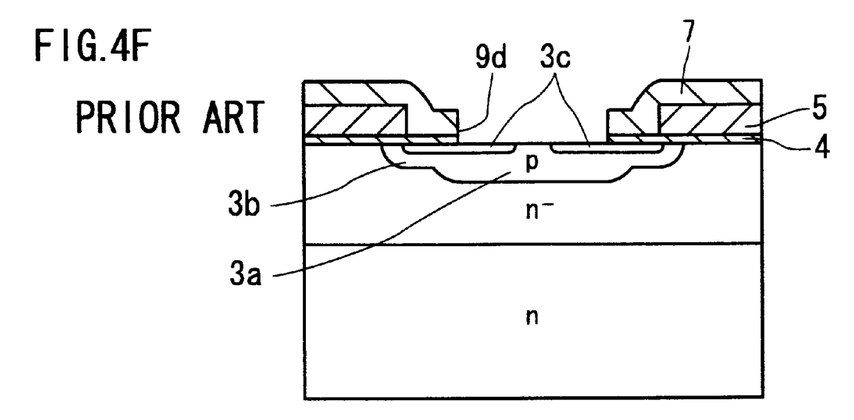

In manufacturing a vertical double diffused MOSFET 1, an n-type epitaxial layer 2b and oxide film 9a is formed on an n-type semiconductor substrate (main body) 2a, as shown in FIG. 4A. The oxide film 9a at one part is removed by etching to form a window 9b. Through this window 9b boron (B) ions are implanted to the surface of the semiconductor substrate 2. After etch-removing oxide film 9a, the boron (B) ions are thermally diffused to thereby provide a main diffusion region 3a. Simultaneous with this, a not-shown thermal oxide film is formed. As shown in FIG. 4B, this thermal oxide film is etched under a predetermined condition into an oxide film 4 having a thick walled portion 9c. Subsequently, as shown in FIG. 4C a gate electrode 5 is formed on the oxide film 4, and part of the gate electrode is etched to thereby provide a window 5a. Then, boron (B) ions are implanted through, as a mask, the gate electrode 5 into the surface of the semiconductor substrate 2. The implanted boron ions are thermally diffused to form a channel diffusion region 3b. Further, phosphorus (P) ions are implanted through, as a mask, the gate electrode 5 and thick walled portion 9c to the surface of the semiconductor substrate 2. The implanted phosphorus ions are then thermally diffused to provide a source diffusion 3c. Then an insulation layer 7 is formed over the oxide film 4 and gate electrode 5, as shown in FIG. 4E. Subsequently, as shown in FIG. 4F, the insulation layer 7 and oxide film 4 is partly etched away to form a contact hole 9d. Thereafter, a metal interconnect layer 8 is formed on the insulation layer 7 in a manner of connected to the source diffusion region 3c, as shown in FIG. 3. Further, a drain electrode 6 is formed at the underside of the semiconductor substrate 2.

In the prior art, however, the insulation layer 7 has used silicon oxide containing phosphorus (PSG). Therefore, it has been impossible to completely block contaminants, such as mobile ions, from intruding into the electrode 5 during the manufacturing process or in an operational environment after manufacture. Due to this, there has been a problem that the gate electrode 5 deteriorates in electric characteristic (threshold voltage, etc) due to aging.

On the other hand, the thick walled portion 9c was formed in a separate process (FIG. 4B) from the process of forming the main diffusion region 3a (FIG. 4A), making the manufacture process complicated. Moreover, there existed a fear that misalignment might occur in each of the processes. If a misalignment is caused during the process of forming the thick walled portion 9c, the source diffusion regions 3c on the left and right of the thick walled portion 9c are formed into different widths with respect to each other. Thus, there has been a fear of causing variation in electric current amount to be supplied to these source diffusion regions 3c from the metal interconnect layer 8.

SUMMARY OF THE INVENTION

Therefore, it is a primary object of the present invention to provide a vertical double diffused MOSFET which is capable of preventing the gate electrode from deteriorating in its characteristic, and a method for manufacturing such a device.

It is another object of the present invention to provide a method for manufacturing a vertical double diffused MOSFET wherein the process that might lead to misalignment is eliminated thus stabilizing product quality.

A vertical double diffused MOSFET according to the present invention is characterized in that a nitride film is used as an insulation layer interposed between a gate electrode and a metal interconnect layer.

That is, a vertical double diffused MOSFET, comprises: a semiconductor substrate; an oxide film formed on the semiconductor substrate; a gate electrode formed on the oxide film and having at least one window; a nitride film formed on the oxide film and the gate electrode; an ion implant window formed through the nitride film at a center of the window, ions of a first conductivity type being implanted through the ion implant window to the semiconductor substrate and thermally diffused thereby forming a main diffusion region; a thick walled portion formed by growing the oxide film in the ion implant window, wherein ions of the first conductivity type are implanted through, as a mask, the gate electrode and the nitride film on the gate electrode into the semiconductor substrate and thermally diffused to form a channel diffusion region, and ions of a second conductivity type being implanted through, as a mask, the thick walled portion, the gate electrode and the nitride film on the gate electrode into the semiconductor substrate and thermally diffused, thereby forming a source diffusion region.

A method for manufacturing a vertical double diffused MOSFET according to the present invention, comprises the steps of: (a) forming an oxide film on a substrate; (b) forming a gate electrode having at least one window on the oxide film; (c) forming a nitride film as an insulation layer on the oxide film and the gate electrode; (d) forming an ion implant window through the nitride film at a center of the window; (e) implanting ions of a first conductivity type through the ion implant window to the substrate; (f) thermally diffusing the ions to form a main diffusion region and growing the oxide film inside the ion implant window to form a thick walled portion; (g) implanting ions of the first conductivity type through, as a mask, the thick walled portion, the gate electrode and the nitride film on the gate electrode to the substrate and thermally diffused to form a channel diffusion region; and (h) implanting ions of a second conductivity type through a mask of the thick walled portion, the gate electrode and the nitride film on the gate electrode to the substrate and thermally diffused to form a source diffusion region.

In the vertical double diffused MOSFET according to the present invention, the nitride film interposed between the gate electrode and the metal interconnect layer has a dense film texture. This nitride film serves to physically shield contaminants from entering into the gate electrode. Consequently, the gate electrode is prevented from deteriorating in characteristic due to contaminants.

Furthermore, in the manufacturing method, the main diffusion region and the thick walled portion are simultaneously formed in the step (f). This reduces the number of processes leading to misalignment as compared to the prior art of FIG. 4 wherein these formations are carried out by different processes. Also, the ions implanted through the ion implant window to the semiconductor substrate are thermally diffused to provide a main diffusion region, simultaneous with which a thick walled portion is formed inside the ion implant window by thermal oxidation. Thus, the thick walled portion is accurately formed at a center of the main diffusion region. It is therefore possible to simplify the manufacturing process and stabilize the MOSFET quality.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
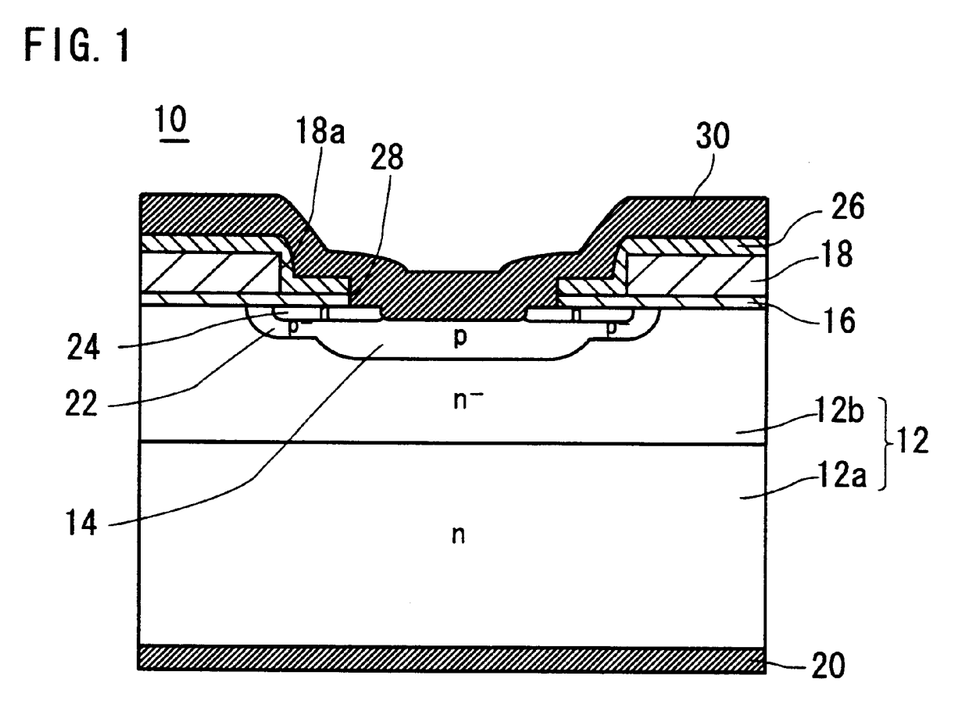
FIG. 1 is an illustrative view showing an embodiment of the present invention.

Referring to FIG. 1, there is illustrated a vertical double diffused MOSFET 10 of this embodiment, which includes a semiconductor substrate 12 having an n-type main body 12a and an n-type epitaxial layer 12b. The semiconductor substrate 12 has a main diffusion region 14 formed in a first conductivity type (e.g. "p-type") in a surface thereof. The semiconductor substrate 12 has, on the surface, a gate electrode 18 having at least one window 18a formed through a gate dielectric film 16. The semiconductor substrate 12 also has a drain electrode 20 formed on an underside of the semiconductor substrate 12. In the surface of the semiconductor substrate 12 are formed a p-type channel diffusion region 22 in association with the gate electrode at a periphery of the window 18a as well as a source diffusion region 24 in a second conductivity type (e.g. "n-type"). A nitride film (insulation layer) 26 is formed of silicon nitride (SiN) or the like on the gate electrode 18. On the nitride film, a metal interconnect layer (source electrode) 30 is formed connecting to a source diffusion region 24 through a contact hole 28. The nitride film 26 has a texture that is by far denser than a film texture of the conventional insulation layer (PSG) 7, as was shown in FIG. 3. Thus the nitride film 26 serves as a protection film to physically shield contaminants (movable ions, etc.) from intruding into the gate electrode 18.

It will be noted that FIG. 1 illustrates a minimum unit constituting a MOSFET 10. In actual, however, such structures are horizontally continuously formed in an array form wherein the gate electrode 18 is provided for all the device cells. That is, the illustrated MOSFET 10 is so-called a single gate MOSFET, and considered separately from a so-called dual gate MOSFET.

Figure 2A:
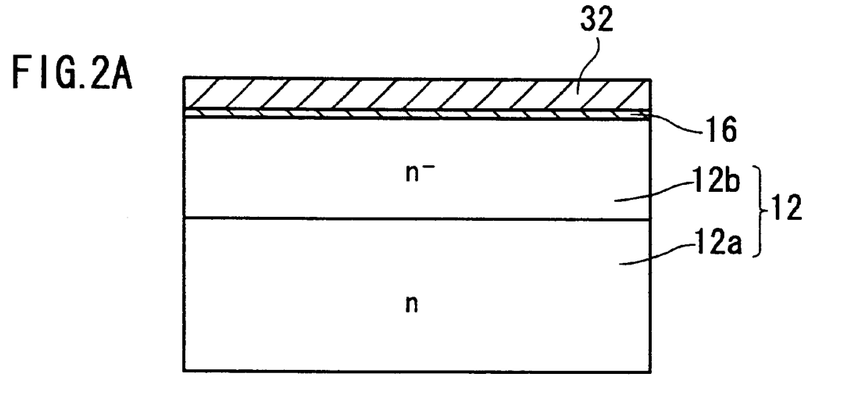
FIGS. 2A–FIG. 2I are sectional views showing a process for the FIG. 1 embodiment.
Figure 2B:
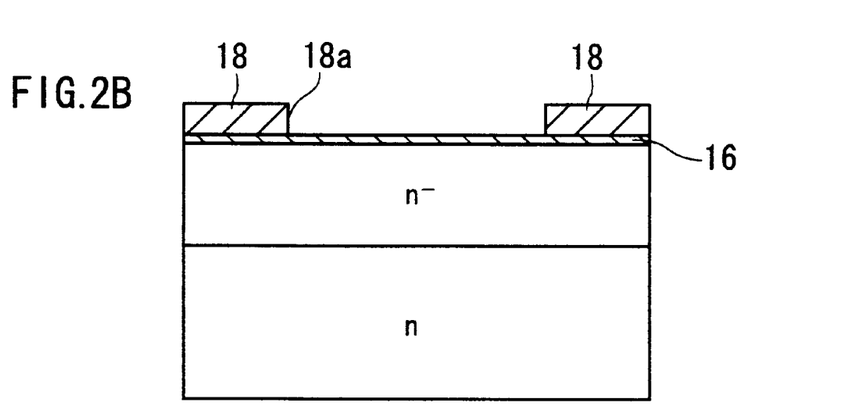
Figure 2C:
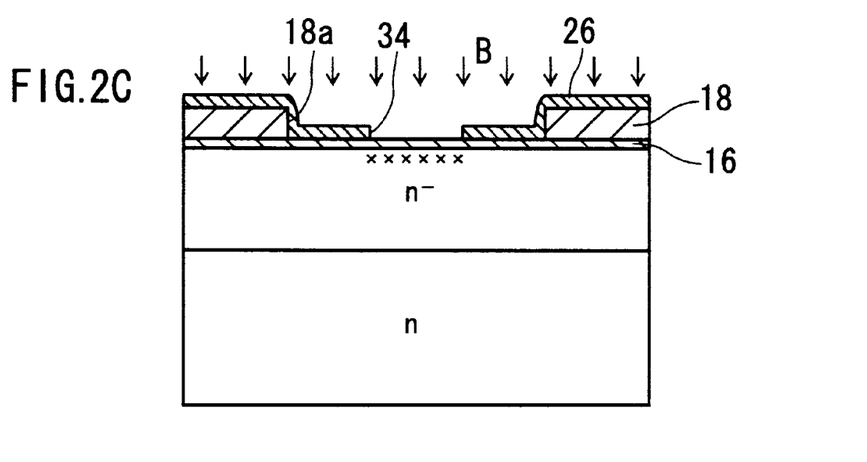

Explanation is made below on a method for manufacturing a vertical double diffused MOSFET 10 with reference to FIGS. 2A–FIG. 2I. First, an n-type epitaxial layer 12b is formed on an n-type silicon (Si) main body 12a, as shown in FIG. 2A. On the epitaxial layer, an oxide film ($SiO_2$) 16 is formed to a thickness of approximately 300–1000 Å by a thermal oxidation technique. Further, a polysilicon (poly-Si) film 32 is formed to a thickness of approximately 4000–11000 β on the oxide film by a CVD technique. By implanting a predetermined concentration of phosphorus (P) ions into the polysilicon film 32, a gate electrode 18 is formed. Subsequently, as shown in FIG. 2B the gate electrode 18 is masked by not-shown resist to perform etching, thereby forming a window 18a. Then, a nitride film 26 is formed to a thickness of approximately 3000–8000 Å over the gate electrode 18 and oxide film 16, by the CVD technique as shown in FIG. 2C. The nitride film 26 is etched at a center of the window 18a to thereby form a ion-implant window 34 having a width of approximately 4–25 μm. Through this ionimplant window 34, boron (B) ions are implanted under a predetermined condition (e.g., acceleration energy: 50–150 KeV, dosage: $1\times10^{14}$–$5\times10^{15}$ atoms/cm$^2$) into the surface of the semiconductor substrate 12.

Figure 2D:
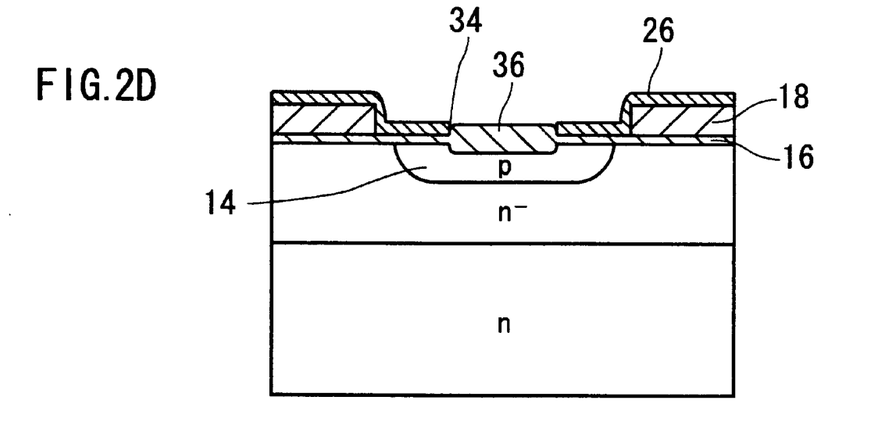
Figure 2E:
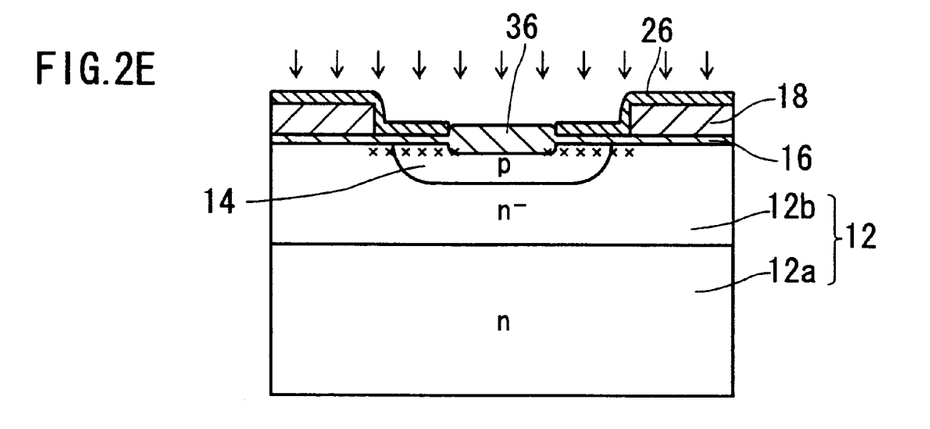
Figure 2F:
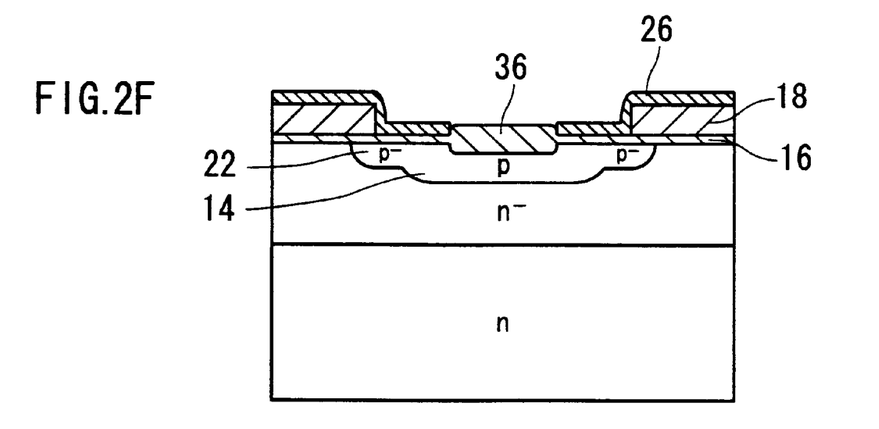

Then, the boron (B) ions are thermally diffused to provide a main diffusion region 14 with a depth of approximately 3–8 μm, as shown in FIG. 2D. Further, the oxide film 16 at a portion exposed by the ion implant winder 34 is thermally grown into a thick walled portion 36 having a thickness of approximately 2500–6500 Å. Subsequently, boron (B) ions are implanted through, as a mask, the thick walled portion 36, the gate electrode 18 and the nitride film 26 on the gate electrode 18 into the surface of the semiconductor substrate 12 as shown in FIG. 2E, under a predetermined condition (e.g., acceleration energy: 50–150 KeV, dosage: $1\times10^{13}$–$8\times10^{13}$ atoms/cm$^2$). As shown in FIG. 2F, the boron (B) ions are thermally diffused to form channel diffusion region 22 having a depth of approximately 2–5 μm.

Figure 2G:
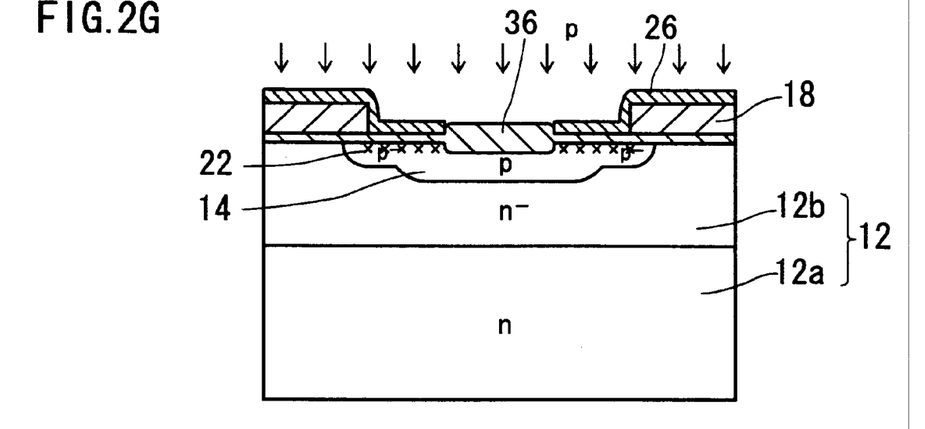
Figure 2H:
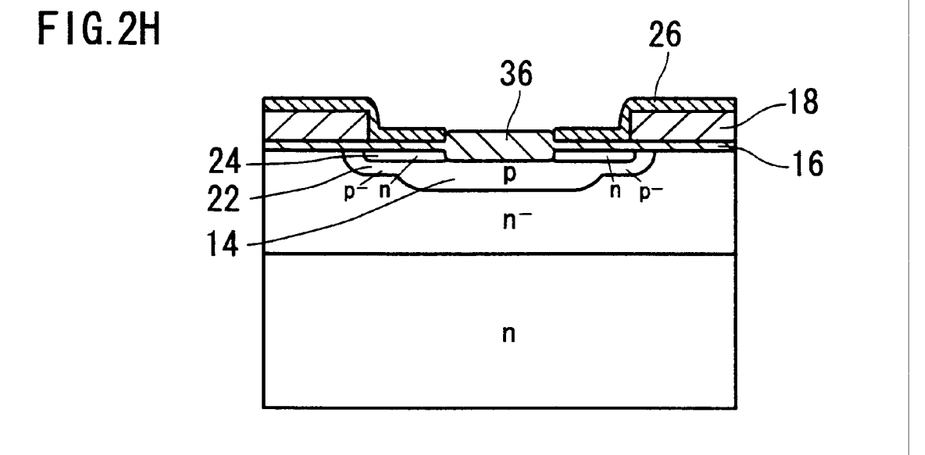
Figure 2I:
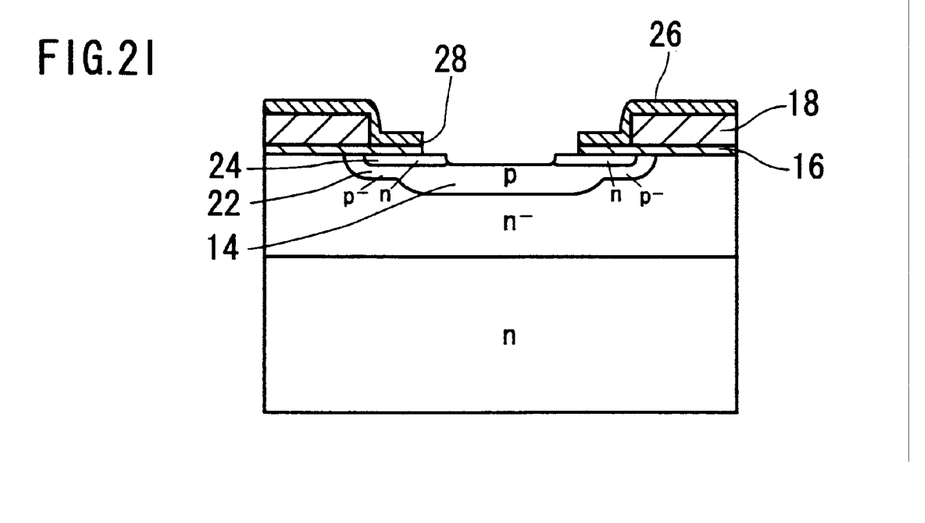

Then, as shown in FIG. 2G phosphorus (P) ions are implanted into the surface of the semiconductor substrate 12 through, as a mask, the thick walled portion 36, gate electrode 18 and the nitride film 26 on the gate electrode 18, under a predetermined condition (e.g. acceleration energy: 100–200 KeV, dosage: $1\times10^{15}$–$1\times10^{16}$ atoms/cm$^2$). The phosphorus (P) ions are thermally diffused to thereby form source diffusion regions 24 with depth of approximately 1–2 μm, as shown in FIG. 2H. Subsequently, a contact hole 28 is formed through the nitride film 26 and oxide film 16 thereby exposing at its bottom the source diffusion regions 24, as shown in FIG. 2I.

Thereafter, an aluminum-based metal is spattered over the nitride film 26 to provide metal interconnect film 30 connected to the source diffusion region 24, as shown in FIG. 1. Further, a drain electrode 20 is formed of an aluminum-based metal by sputter on the underside of the semiconductor substrate 12.

In the MOSFET 10 of this embodiment, the nitride film 26 with a dense film texture positively prevents contaminants (movable ions, etc.) from intruding into the gate electrode 18. Thus the gate electrode 18 is prevented from deteriorating in characteristic. Meanwhile, there is no intervening process between the gate electrode 18 forming process (FIG. 2B) and nitride film 26 forming process. Accordingly, there is no fear that contaminants intrude into the gate electrode during the manufacture process.

Furthermore, the main diffusion region 14 and the thick walled portion 36 are substantially simultaneously formed in the common heating process (FIG. 2D). This can reduce the number of processes in which misalignment might occur, as compared to the prior art having different processes. It is therefore possible to simplify the manufacturing process and stabilize the product quality.

In the above embodiment, the gate electrode 18 used polysilicon (poly-Si). Alternatively, tungsten silicide (WSi) or titanium silicide (TiSi) may be employed. Further, in the above embodiment, the n-type semiconductor elements may be made by a p-type semiconductor and the p-type semiconductor elements by an n-type semiconductor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a vertical double diffused MOSFET, said vertical double diffused MOSFET characterized in that a nitride film is used as an insulation layer interposed between a gate electrode and a metal interconnect layer, whereby the gate electrode is shielded from contaminants by the nitride film and the nitride film enables the formation of the gate electrode and the nitride film without an intervening process.

2. A vertical double diffused MOSFET, comprising:

a semiconductor substrate;

an oxide film formed on said semiconductor substrate;

a gate electrode formed on said oxide film, said gate electrode having at least one window;

a nitride film formed on said oxide film and said gate electrode;

an ion implant window formed through said nitride film, said ion implant window being formed at a center of said window, ions of a first conductivity type being implanted through said ion implant window to said semiconductor substrate, said ions of the first conductivity type being thermally diffused to form a main diffusion region; and a thick walled portion formed by growing said oxide film in said ion implant window, wherein ions of the first conductivity type are implanted into said semiconductor substrate through a mask of said gate electrode and said nitride film, said ions of the first conductivity type being thermally difused to form a channel diffusion region, ions of a second conductivity type being implanted into said semiconductor substrate through a mask of said thick walled portion, said gate electrode and said nitride film, said ions of the second conductivity type being thermally diffused to form a source diffusion region, whereby the gate electrode is shielded from contaminants by the nitride film and the nitride film enables the formation of the gate electrode and the nitride film without an intervening process.

3. A vertical double diffused MOSFET according to claim 2, wherein said main diffusion region and said thick walled portion are substantially simultaneously formed in one heating process.

* * * * *